US008299817B2

(12) United States Patent
Goh et al.

(10) Patent No.: US 8,299,817 B2
(45) Date of Patent: Oct. 30, 2012

(54) CIRCUIT AND METHOD FOR ADDING DITHER TO VERTICAL DROOP COMPENSATION USING LINEAR FEEDBACK SHIFT REGISTERS

(75) Inventors: Beng-Heng Goh, Singapore (SG); Srijith Varma Vijaya Varma, Singapore (SG)

(73) Assignee: STMicroelectronics Asia Pacific Pte Ltd., Singapore (SG)

(*) Notice: Subject to any disclaimer, the term of this patent is extended or adjusted under 35 U.S.C. 154(b) by 0 days.

(21) Appl. No.: 12/957,046

(22) Filed: Nov. 30, 2010

(65) Prior Publication Data

US 2012/0133391 A1 May 31, 2012

(51) Int. Cl.
*G09G 5/02* (2006.01)
*H03K 19/173* (2006.01)

(52) U.S. Cl. .......................................... 326/46; 345/596

(58) Field of Classification Search .................... 326/46, 326/37–41, 47, 101; 345/596–598
See application file for complete search history.

(56) References Cited

U.S. PATENT DOCUMENTS

| | | | | |
|---|---|---|---|---|
| 5,383,143 | A * | 1/1995 | Crouch et al. | 708/254 |
| 5,488,612 | A * | 1/1996 | Heybruck | 714/725 |
| 5,515,383 | A * | 5/1996 | Katoozi | 714/732 |
| 5,631,913 | A * | 5/1997 | Maeda | 714/732 |
| 6,442,579 | B1 * | 8/2002 | Hansson | 708/252 |
| 7,580,157 | B2 * | 8/2009 | Wei | 358/3.26 |
| 2006/0282732 | A1 * | 12/2006 | Kiryu | 714/738 |
| 2007/0047623 | A1 * | 3/2007 | Eun et al. | 375/130 |

OTHER PUBLICATIONS

Mitola et al., Software Radio Technologies Selected Readings, A Selected Reprint Volume, IEEE Press, Piscataway, NJ, 2001, pp. 64.

Waheed et al., Spurious-Free Time-to-Digital Conversion in an ADPLL Using Short Dithering Sequences, IEEE Transactions on Circuits and Systems-I: Regular Papers, vol. 58, No. 9, Sep. 2011, pp. 10.

Hsieh et al., Spectral Shaping of Dithered Quantization Errors in Sigma-Delta Modulators, IEEE Transactions on Circuits and Systems-I: Regular Papers, vol. 54, No. 5, May 2007, pp. 7.

Pjevalica et al., Further Generalization of the Low-Frequency True-RMS Instrument, IEEE Transactions on Instrumentation and Measurement, vol. 59, No. 3, Mar. 2010, pp. 9.

Mohsen et al., 13-bit 205 MS/s Time-Interleaved Pipelined ADC with Digital Background Calibration, IEEE 2010, pp. 4.

Kowatsch et al., A Spread-Spectrum Concept Combining Chirp Modulation and Pseudonoise Coding, IEEE Transaotions on Communications, Vol Com-31, No. 10, Oct. 1983, pp. 10.

Li et al., Design and Implementation of the Digital Controller for Boost Converter based on FPGA, IEEE 2011, pp. 6.

Aouini et al., A Predictable Robust Fully Programmable Analog Gaussian Noise Source for Mixed-Signal/Digital ATE, International Test Conference Paper 28.1, IEEE 2006, pp. 10.

(Continued)

*Primary Examiner* — Thienvu Tran
(74) *Attorney, Agent, or Firm* — Hogan Lovells US LLP

(57) ABSTRACT

Vertical dithering is performed for vertical droop compensation in image processing using Linear Feedback Shift Registers (LFSRs). Line memories are not used. A compensation circuit includes a signature reload input signal coupled to the input of five LFSRs. Each LFSR includes a signature store. The output of each LFSR provides a sequence output signal that is gated with a corresponding enable signal in a first logic circuit. The output of all of the first logic circuits are combined in a second logic circuit to provide a control signal output.

13 Claims, 10 Drawing Sheets

OTHER PUBLICATIONS

Bashiri et al., Spur Reduction in Bang-Bang PLLs Using Programmable Bit-stream, Electronics Letters, Sep. 15, 2011, vol. 47, No. 19, pp. 2.
Pickholtz et al., Theory of Spread-Spectrum Communications—A Tutorial, IEEE Transactions on Communications, vol. Com-30, No. 5, May 1982, pp. 30.
Thambidurai et al., On Pulse Position Modulation and Its Application to PLLs for Spur Reduction, IEEE Transactions on Circuits and Systems—I: Regular Papers, vol. 58, No. 7, Jul. 2011, pp. 14.
Vucetic et al., Recent Advances in Turbo Code Design and Theory, Invited Paper, from Proceedings of the IEEE, vol. 95, No. 6, Jun. 2007, pp. 22.
1996 Index, IEEE Transactions on Circuits and Systems II: Analog and Digital Signal Processing, vol. 43, IEEE T-CAS2, pp. 14.
Ponnusamy et al., Acquisition of Pseudonoise Codes in FH Systems, IEEE Transactions on Aerospace and Electronic Systems, vol. AES-17, No. 3, May 1981, pp. 7.
Patent Abstracts, IEEE Microwave and Guided Wave Letters, vol. 6, No. 10, Oct. 1996, pp. 7.
Meninger et al., A Fractional-N Frequency Synthesizer Architecture Utilizing a Mismatch Compensated PFD/DAC Structure for Reduced Quantization-Induced Phase Noise, IEEE Transactions on Circuits and Systems—II: Analog and Digital Signal Processing, vol. 50, No. 11, Nov. 2003, pp. 11.
Fahim et al., A Wideband Sigma-Delta Phase-Locked-Loop Modulator for Wireless Applications, IEEE Transactions on Circuits and Systems—II: Analog and Digital Signal Processing, vol. 50, No. 2, Feb. 2003, pp. 10.
Galton et al., A Rigorous Error Analysis of D/A Conversion with Dynamic Element Matching, IEEE Transactions on Circuits and Systems—II: Analog and Digital Signal Processing, vol. 42, No. 12, Dec. 1995, pp. 10.
Giannini et al., A 2-mm2 0.1-5 GHz Software-Defined Radio Receiver in 45-nm Digital CMOS, IEEE Journal of Solid-State Circuits, vol. 44, No. 12, Dec. 2009, pp. 13.
Norsworthy, Chapter 3: Quantization Errors and Dithering in Delta-Sigma Modulators, Delta-Sigma Data Converters: Theory, Design, and Simulation, IEEE Press, Piscataway, NJ, 1997, pp. 68.
Pamarti, Digital Techniques for Integrated Frequency Synthesizers: A Tutorial, from Integrated Circuits for Communications, IEEE Communications Magazine, Apr. 2009, pp. 8.
Holte et al., A New Digital Echo Canceler for Two-Wire Subscriber Lines, IEEE Transactions on Communications, vol. Com-29, No. 11, Nov. 1981, pp. 9.
Temporiti et al., A 3.5 GHz Wideband ADPLL With Fractional Spur Suppression Through TDC Dithering and Feedforward Compensation, IEEE Journal of Solid-State Circuits, vol. 45, No. 12, Dec. 2010, pp. 14.
Soh et al., Programmable Low-Dithering-Jitter Interpolator-based CDR, IEEE 2011 International Symposium on Integrated Circuits, pp. 4.
Lei et al., Dynamic Dithering Algorithm and Frame Rate Control Technique for Liquid Crystal Display Controller, IEEE 2003, pp. 4.

* cited by examiner

CIRCUIT AND METHOD FOR ADDING DITHER TO VERTICAL DROOP COMPENSATION USING LINEAR FEEDBACK SHIFT REGISTERS

BACKGROUND OF THE INVENTION

The present invention relates to video processing and more specifically to compensating for vertical droop in a video frame using a Linear Feedback Shift Register circuit without the need for using line memories.

Referring now to FIG. 1 a frame 102 of a video image is shown that is, for example 1600 pixels×1280 lines. Each line can include one to two thousands of pixels. The number of lines in a frame can also be one to two thousands. Ideally, for a uniform image value of 200, every pixel should have a value of 200. Due to offsets and mismatches in a given design, there will be droops both horizontally and vertically. As shown above, the vertical droop is one less for each of the sections A through D from top to bottom. The vertical droop can be compensated by adding offsets to each of the pixels. For example, pixels in zone B will have an added value of one, pixels in zone C will have an added value of two, and pixels in zone D will have an added value of three.

Referring now to FIG. 2 another typical frame 202 of a video image is shown. Another example of vertical droop compensation is shown for frame 202. As before, a pixel value is added to compensate for vertical droop in a given design. In the example of FIG. 2, an offset of ten is added in section A, an offset of eleven is added in section B, an offset of twelve is added in section C, and an offset of thirteen is added in section D.

With respect to the video frames shown in FIGS. 1 and 2, it is important to note that there will be vertical line artifacts due to this vertical droop compensation. Hence, dither has to be introduced to blur out these transitions from one section to another. It is also important to note that, for dither to be effective, the dither should be introduced over a few lines (maybe more than ten lines). A very blunt way to implement this dither is to have ten line memories to remember which pixels have been compensated. For each line, each pixel is compensated randomly. Finally all the pixels in the row are compensated after 10 lines.

A prior art circuit 300 for vertical dithering with line memories is shown in FIG. 3. Circuit 300 includes an LFSR 302 for generating a random sequence signal RND_SEQ. A plurality of line memories 304A, 304B, 304C, 304D, and 304E receives the RND_SEQ signal and a plurality of read/write signals WR1, WR2, WR3, WR4, and WR5. Each line memory generates an output sequence signal corresponding to signals SEQ1, SEQ2, SEQ3, SEQ4, and SEQ5 in FIG. 3. Each output sequence signal is gated with a corresponding AND gate 306A, 306B, 306C, 306D, or 306E. The gating signals for the AND gates are EN1, EN2, EN3, EN4, and EN5. The output of all of the AND gates is received by OR gate 308 to provide the CONTROL output signal.

In operation, the line memories are used to store one bit for each of the pixel to control whether to add an offset or not. While writing to line memory 304A (Line Memory 1), the RND_SEQ is also sent out as CONTROL as an offset control for the pixels. While writing to line memory 304B (Line Memory 2), the SEQ1 and RND_SEQ signals are also enabled to control the offset compensation. Similarly, while writing to line memory 304C (Line Memory 3), the SEQ1, SEQ2 and RND_SEQ signals are all enabled to control the offset compensation. This process is repeated for all line memories shown. While five line memories are shown, any number can be used.

While the circuit shown in FIG. 3, is effective for addressing for providing the required dithering, it uses line memories. These line memories can be large, which increases die size and cost.

What is desired is a dithering circuit for use in vertical droop compensation that eliminates the need for large line memories, reducing chip size and cost, and thereby increasing profit margins.

SUMMARY OF THE INVENTION

According to the present invention, a vertical dithering circuit includes a signature reload input, a plurality of Linear Feedback Shift Registers (LFSRs) each having an input coupled to the signature reload input and an output for providing a sequenced output signal, a first logic circuit having a plurality of inputs coupled to the outputs of the plurality of LFSRs, and a plurality of outputs, and a second logic circuit having a plurality of inputs coupled to the outputs of the first logic circuit, and an output for providing a control signal. Each LFSR includes a signature store that can include a plurality of flip-flops. The first logic circuit includes a plurality of AND gates having a plurality of inputs for receiving a plurality of enable signals. The second logic circuit includes an OR gate. Each of the LFSRs comprises a shift register and a plurality of XOR gates.

Another embodiment of the vertical dithering circuit includes a signature reload input, a single Linear Feedback Shift Register (LFSR) having an input coupled to the signature reload input and a plurality of outputs for providing a corresponding plurality of sequenced output signals, a first logic circuit having a plurality of inputs coupled to the plurality of outputs of the LFSR, and a plurality of outputs, and a second logic circuit having a plurality of inputs coupled to the outputs of the first logic circuit, and an output for providing a control signal. In this embodiment, the plurality of sequenced output signals are provided by a plurality of logically combined taps of the LFSR.

In operation, a vertical dithering method according to the present invention includes providing a signature reload signal, providing a plurality of pseudo-random sequences in response to the signature reload signal, gating the pseudo-random sequences using a plurality of enable signals, and logically combining the gated pseudo-random sequences to generate a control signal.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION

Figure 1:
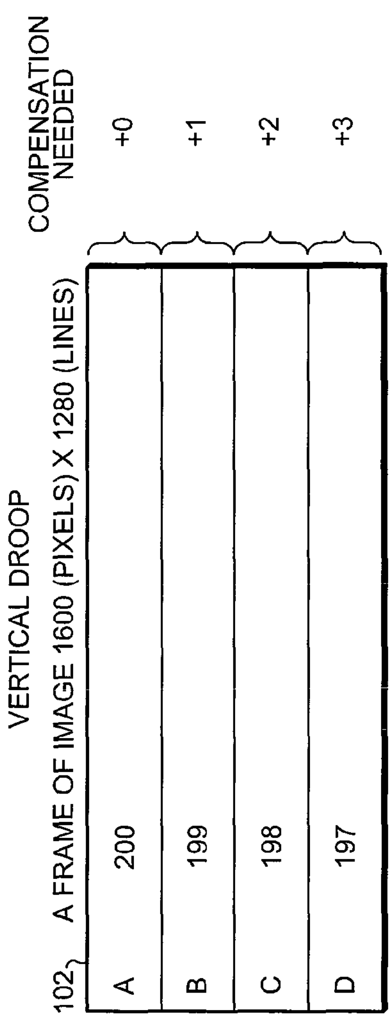
Fig. 1 Prior Art
FIG. 1 is a frame of an image showing vertical droop according to the prior art.
Figure 2:
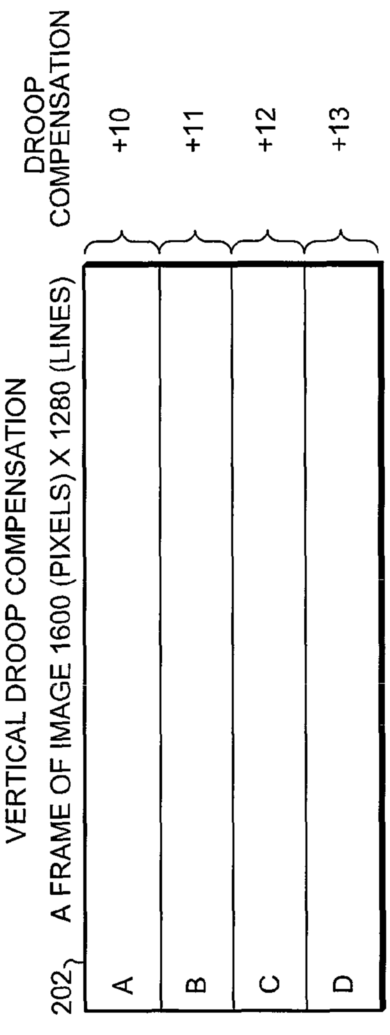
Fig. 2 Prior Art
FIG. 2 is a frame of an image showing the desired vertical droop compensation according to the prior art.
Figure 3:
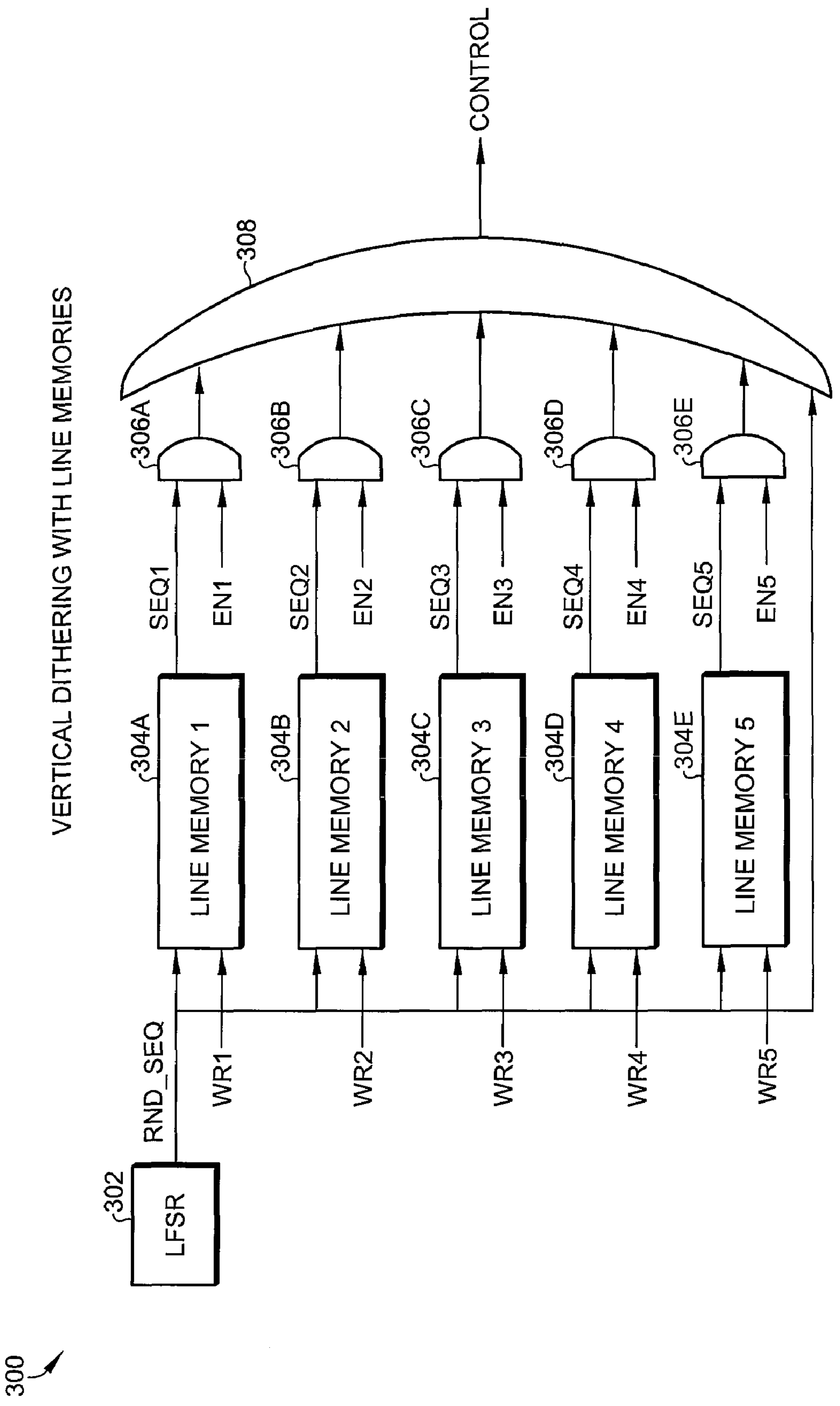
Fig. 3 Prior Art
FIG. 3 is a schematic diagram of a prior art vertical dithering circuit using line memories.
Figure 4:
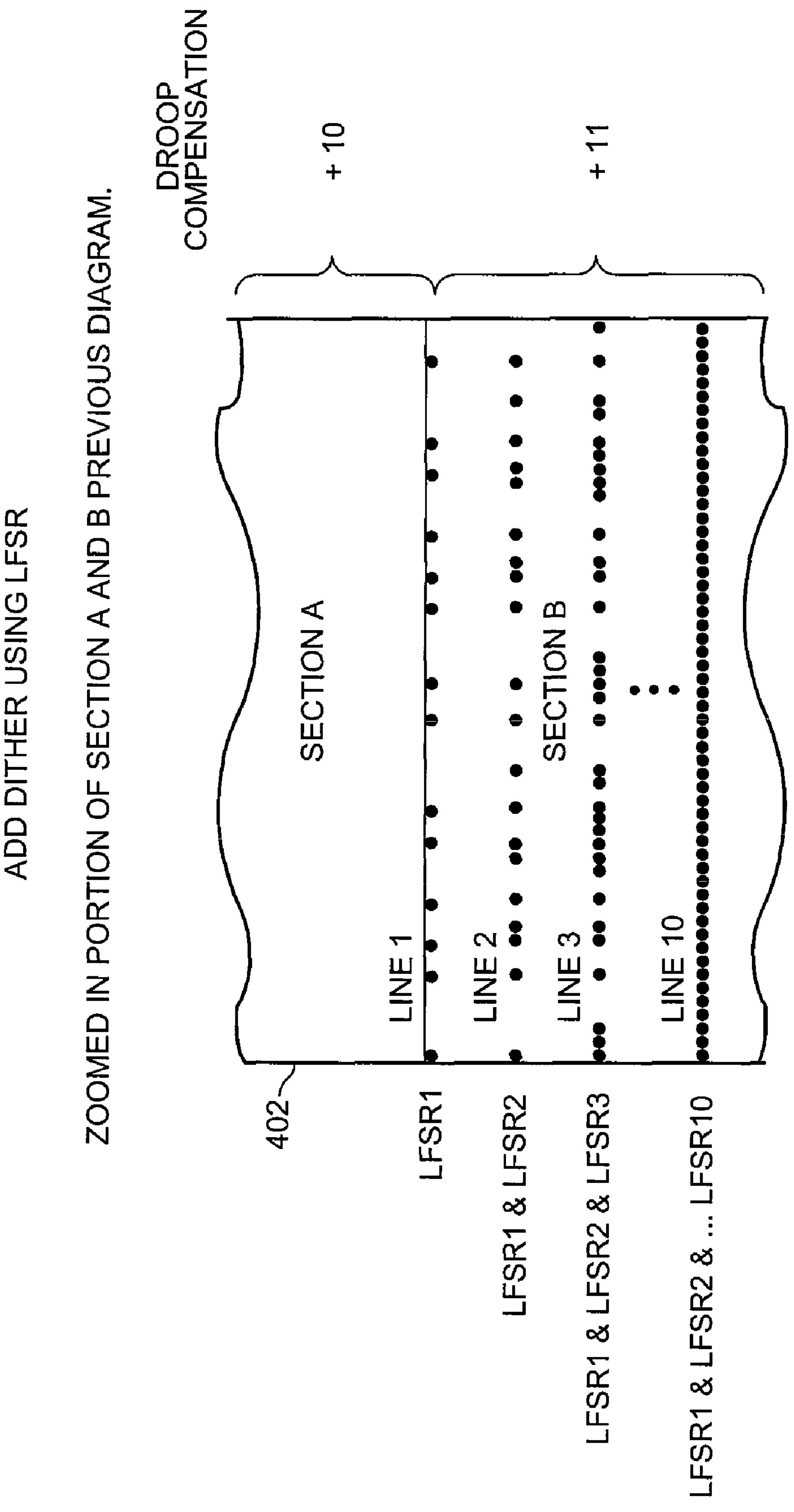
FIG. 4 is an expanded view of a frame of an image showing added dither for vertical droop compensation using LFSRs according to the present invention.

Referring now to FIG. 4, an expanded view of sections A and B of a video image frame is shown. The method of adding dither using an LFSR is explained with reference to FIG. 4. Upon power up, all Linear Feedback Shift Registers (LFSRs) will start running randomly from its seed value with every pixel clock. At the beginning of line 1, the value of LFSR1 will be remembered. Along line 1, when the shifting out bit of LFSR1 is a one, the droop compensation for that pixel will be added with a count of 11. When the shifting out bit of LFSR1 is a zero, the droop compensation for that pixel will be added with a count of 10. As shown in FIG. 4, a dot represents that particular pixel is being compensated with a count of 11. At the beginning of line 2, the previous registered LFSR1 value is reloaded into the LFSR1. Again, the current value of LFSR2 is registered. Similarly, any bit shifted out of LFSR1 and LFSR2 as a one will add a droop compensation of 11 to the current pixel. Hence, the dots for the line 2 is the cumulative effect of the LFSR1 and LFSR2. Notice that more pixels will be compensated with the value of 11. At the beginning of line 3, the previous registered values of LFSR1 and LFSR2 are loaded accordingly. Simultaneously, the current value of LFSR3 is registered. Similarly, any bit shifted out of LFSR1, LFSR2 and LFSR3 as a one will add a droop compensation of 11 to the current pixel. Hence, more dots are added randomly to line 3. Finally, at line 10, all pixels will be added with a droop compensation of 11. The LFSR1 through LFSR10 sequences can be generated using a plurality of LFSRs as explained in further detail below. However, the LFSR1 through LFSR10 sequences can also be generated from a single LFSR but derived from different tappings of the LFSR using various "ANDING" and "ORING" functions. It is important to note that the method described with respect to FIG. 4 is implemented without the use of large line memories. Two embodiments for implementing the method shown in FIG. 4 are thus described in further detail below.

Figure 5:
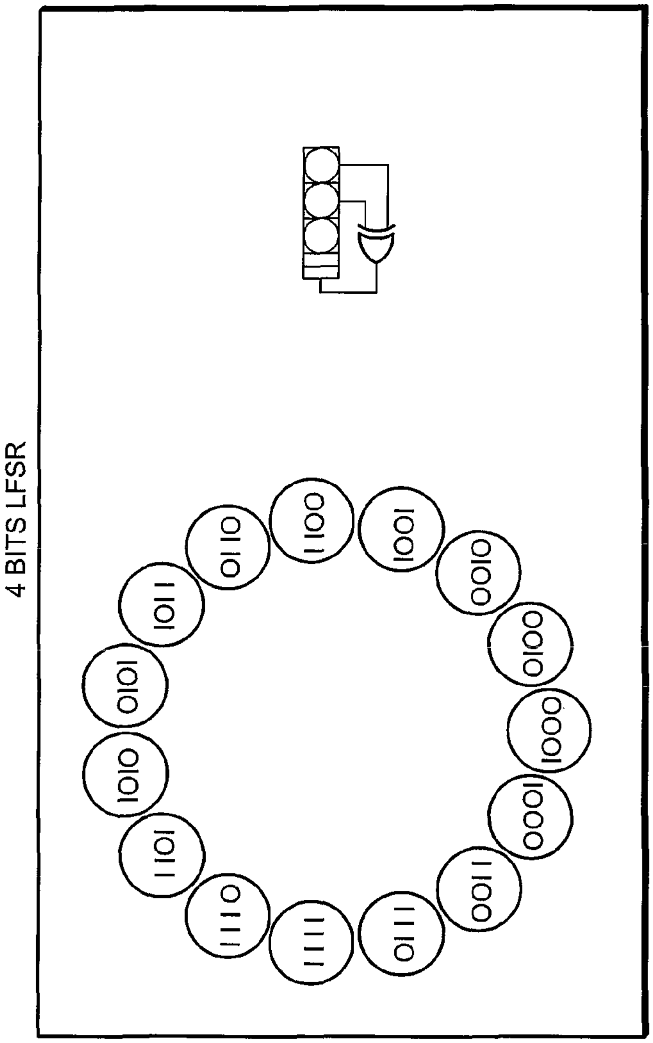
FIG. 5 is a schematic and state diagram of a 4-bit LFSR.

Referring now to FIG. 5, a state diagram and a schematic of a four-bit LFSR is shown. The four-bit LFSR comprises a four bit shift register and a feedback XOR gate as shown. The XOR gate provides feedback to the register that shifts bits from left to right. The maximal sequence includes every possible state in the state diagram except for the "0000" state.

Figure 6:
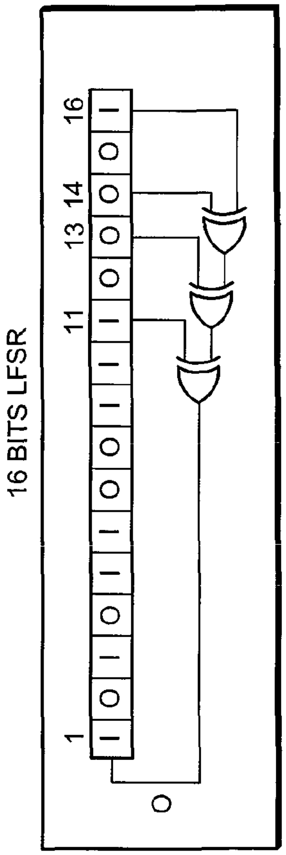
FIG. 6 is a schematic diagram of a 16-bit LFSR.

Referring now to FIG. 6, a sixteen-bit LFSR is shown having a sixteen-bit register and three feedback XOR gates. The bit positions that affect the next state are called the taps. In FIG. 6, the taps are taken at the 16, 14, 13, and 11 bits of the register. The rightmost bit (16) of the LFSR is called the output bit. The taps are XOR'd sequentially with the output bit and then fed back into the leftmost bit. The sequence of bits in the rightmost position is called the output stream. The characteristic polynomial for the 16-bit LFR is: x^16+x^14+x^13+x^11+1.

Based on bench observations, good dithering is obtained when dithering depth is about 20. A practical dithering depth greater than 20 can be, for example, 32. To achieve a uniform distribution of dithering across a depth of 32 lines, the bit width for the LFSR should be a number close to 32. Hence, for the present invention, the bit width of the LFSR is selected to be 28. However, for evaluation purposes, the dithering depth can be changed to 8 or 16 or 32. The design of a 28 bit LFSR is known to those skilled in the art. All of the bits of the LFSR need to be stored. Hence, 28 D-latch flip-flops are needed and are described and shown in further detail below.

The output stream can be used to decide whether to add or not the offset to compensate for the vertical droop for the pixel on the current line. For example, when the output stream is a one, add offset and when it is a zero, do not add offset. For the next line, the output stream will be different and different pixels will be added with the droop compensation offset. Hence, dithering is introduced in the addition to droop compensation of the pixels. If five lines are chosen to finish the dithering process, more pixels on the line will gradually be compensated with the droop offset, as was shown in FIG. 4. For dithering to be performed correctly, the positions of the pixel being compensated must be remembered for all of the lines in the frame until the dithering is completed.

Figure 7:
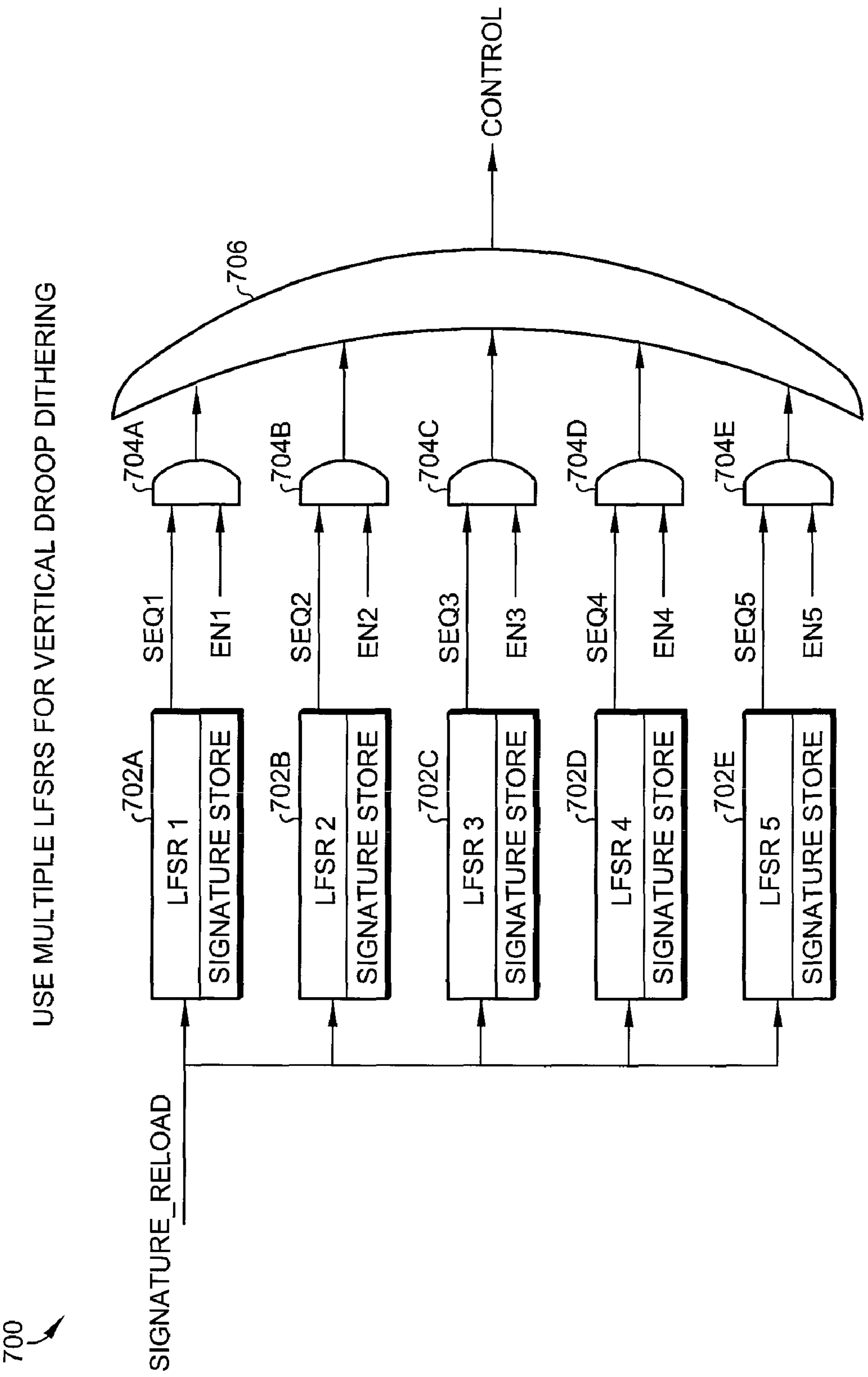
FIG. 7 is a schematic diagram of a first embodiment of a vertical dithering circuit according to the present invention using multiple LFSRs.

Referring to FIG. 7, a first embodiment of a vertical dithering circuit 700 according to the present invention includes comprising a signature reload input for receiving the SIGNATURE_RELOAD signal, a plurality Linear Feedback Shift Registers (LFSRs) 702A, 702B, 702C, 702D, and 702E each having an input coupled to the signature reload input and an output for providing a sequenced output signal. The sequenced output signals are the SEQ1, SEQ2, SEQ3, SEQ4, and SEQ5 signals. A first logic circuit includes a plurality of AND gates 704A, 704B, 704C, 704D, and 704E having a corresponding plurality of inputs coupled to the outputs of the plurality of LFSRs. A second logic circuit, OR gate 706, has a plurality of inputs coupled to the outputs of the first logic circuit, and an output for providing a control signal. Each LFSR comprises a signature store, that can comprise a plurality of flip-flops. In the present invention, twenty-eight such flip-flops are used, but any number can be used. The first logic circuit comprises a plurality of inputs for receiving a plurality of enable signals EN1, EN2, EN3, EN4, and EN5 for gating the sequences provided by the LFSRs. As previously described, each of the LFSRs comprises a shift register and a plurality of XOR gates. With respect to FIG. 7, it is important to note that the line memories were replaced by five LFSRs 702A-702E.

In operation, at the beginning of the lines for dithering, the signature of all LFSRs are remembered. During the line 1 period, the signature for LFSR1 is remembered at the beginning of the line and the SEQ1 signal is used to control the offset compensation. During the line 2 period, the signature for LFSR2 is remembered at the beginning of the line, the signature for LFSR1 is reloaded and both the SEQ1 and SEQ2 signals are used to control the offset compensation. During the line 3 period, the signature for LFSR3 is remembered, and the signatures for LFSR1 and LFSR2 are respectively reloaded. The SEQ1, SEQ2 and SEQ3 signals are used to control the offset compensation. This process is repeated until the dithering process is complete.

Figure 8:
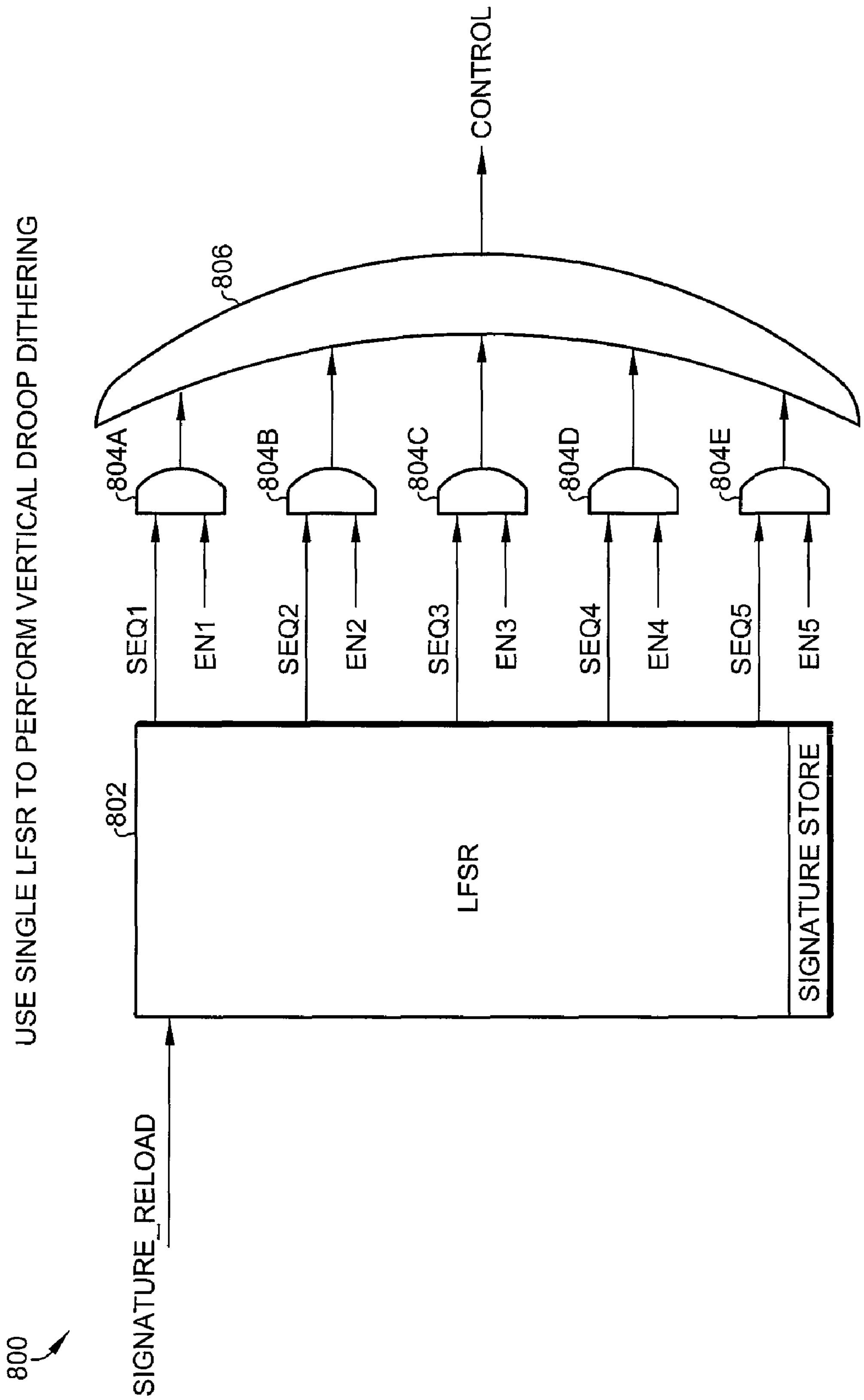
FIG. 8 is a schematic diagram of a second embodiment of a vertical dithering circuit according to the present invention.

Referring now to FIG. 8 a second circuit embodiment of a vertical dithering circuit 800 according to the present invention includes a signature reload input for receiving the SIG- NATURE_RELOAD signal, a single Linear Feedback Shift Register (LFSR) 802 having an input coupled to the signature reload input and a plurality of outputs for providing a corresponding plurality of sequenced output signals SEQ1, SEQ2, SEQ3, SEQ4, and SEQ5. The first logic circuit including AND gates 804A, 804B, 804C, 804D, and 804E, as well as enable signals EN1, EN2, EN3, EN4, and EN5, and the second logic circuit including OR gate 806, as well as the CONTROL output signal is substantially as shown with respect to FIG. 7. The LFSR 802 also includes a signature store as shown, which can be implemented for example by a plurality of one-bit flip-flops. One key difference between the embodiment shown in FIG. 8 and that shown in FIG. 7 is that the plurality of sequenced output signals SEQ1 through SEQ5 are provided by a plurality of logically combined taps of the LFSR, and not by separate LFSRs as shown in FIG. 7. The five LFSRs of FIG. 7 are replaced with one single LFSR in FIG. 8. The different random sequences are derived from the different taps of the LFSR or a combination of ANDING or ORING of the taps.

In operation, during the dithering period, the signature is remembered at the beginning of the first line and reloaded at the beginning of the subsequence line. Note that the positions of a pixel being compensated are folded in the LFSR without the need for huge line memories.

With respect to the signature stores shown in FIGS. 7 and 8, it is important to note that the starting signature for each of the LFSRs is remembered with separate 28 bits flip-flops each (for a 28 bits LFSR). As the process is continued for each of the lines, the signature of each LFSRs changes with the each clock to unfold the pseudo-random pattern. If the process is started each time with the same signature, the LFSR will generate the same pseudo-random pattern. Hence, the LFSR is able to remember the pseudo-random sequence with just 28 bits. The signature is reloaded from the remembered signature for each of the LFSRs in the 28 bits flip-flops (a set of 28 bits flip-flop for each of the LFSR).

Figure 9:
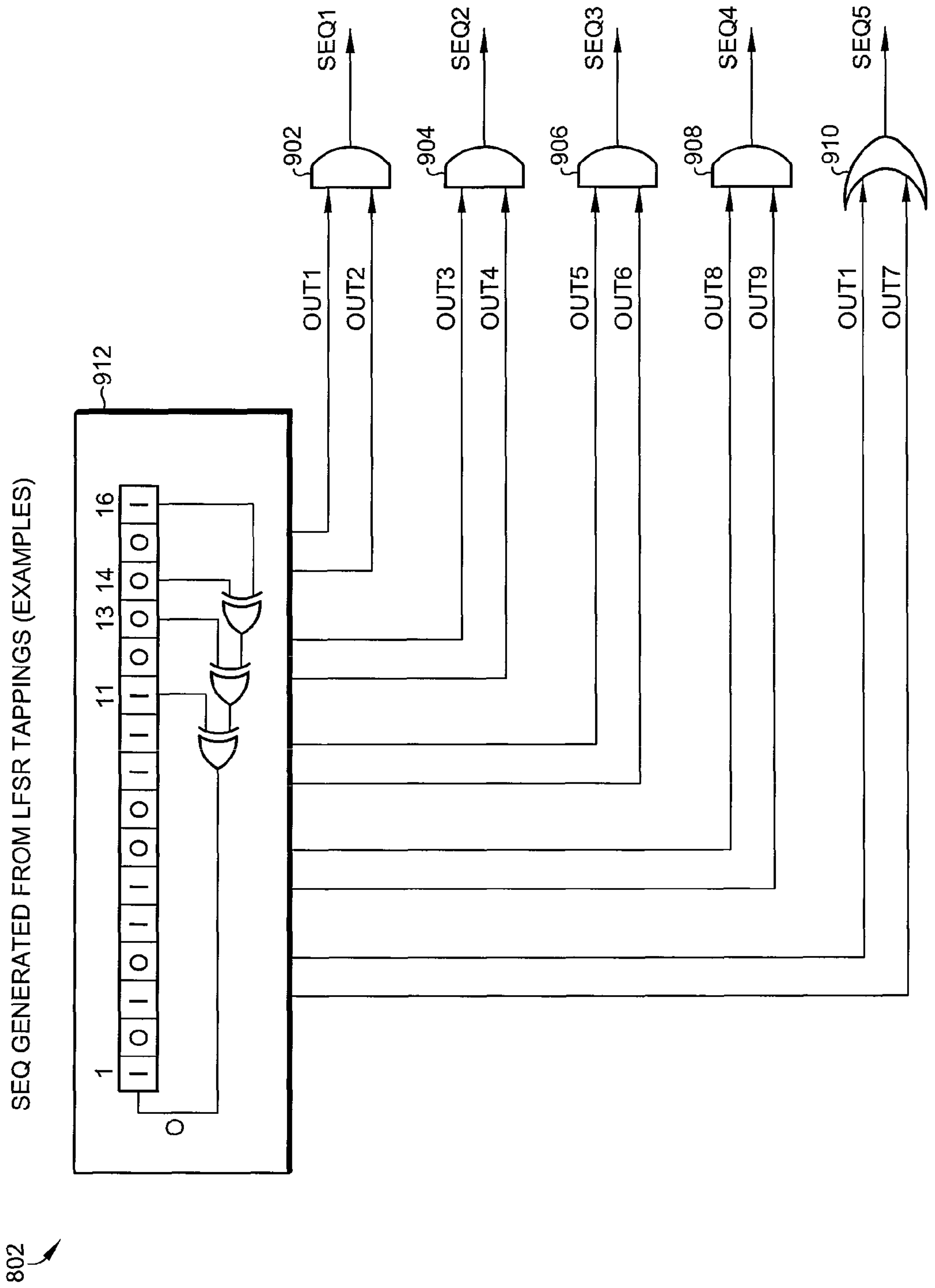
FIG. 9 is a schematic diagram of a circuit for generating sequential signals using multiple taps of a single LFSR according to the present invention.

An example of a single LFSR 802 for use in the circuit of FIG. 8 is shown in FIG. 9. Note that OUT1 and OUT2 are combined in AND gate 902 to generate the SEQ1 signal, OUT5 and OUT4 are combined in AND gate 904 to generate the SEQ2 signal, OUT5 and OUT6 are combined in AND gate 906 to generate the SEQ3 signal, OUT8 and OUT9 are combined in AND gate 908 to generate the SEQ4 signal, and OUT1 and OUT7 are combined in OR gate 910 to generate the SEQ5 signal. The LFSR circuit shown in FIG. 9 is only one example, and many other logical combinations can be used as desired for a particular application.

Figure 10:
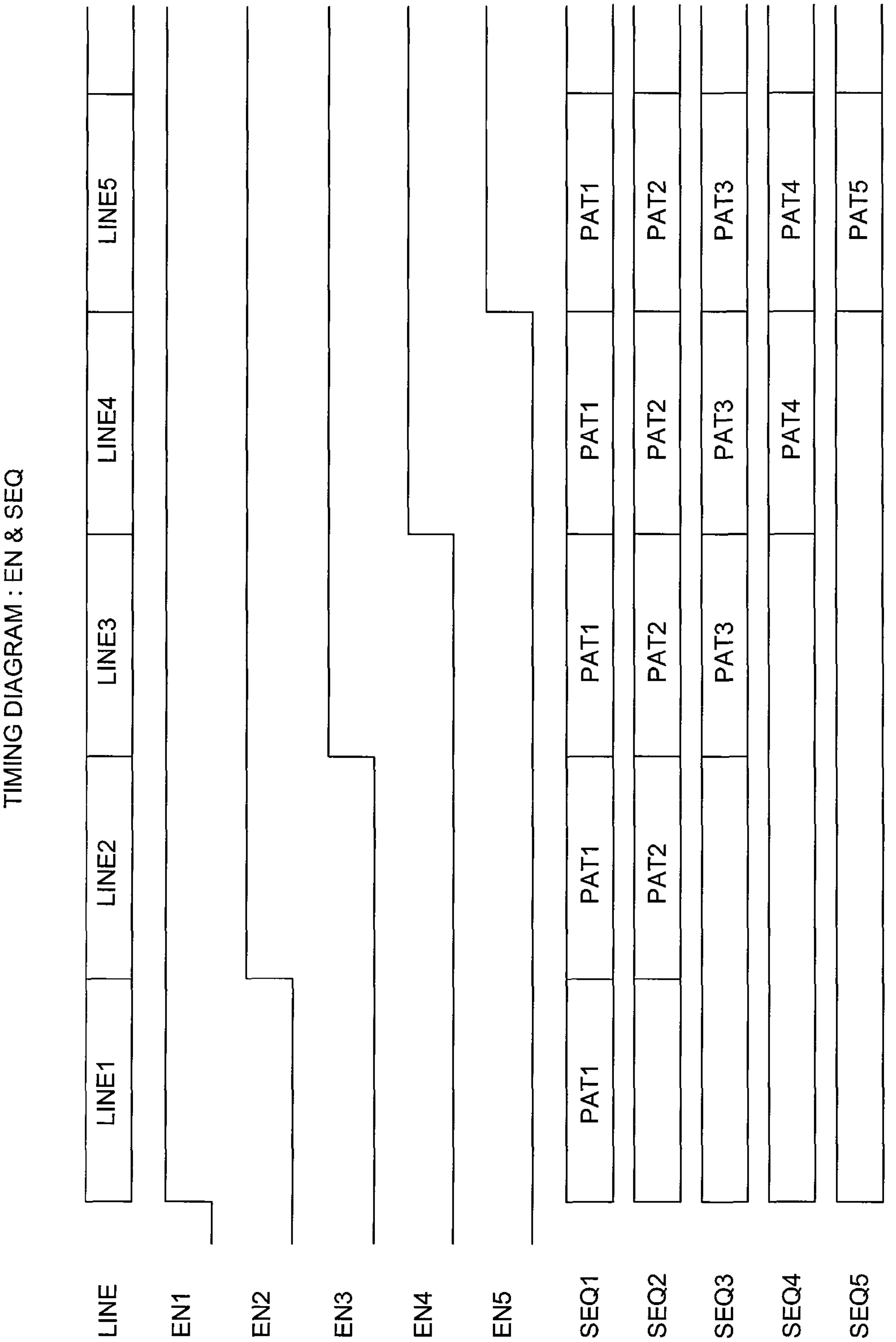
FIG. 10 is a timing diagram associated with the circuits of FIG. 7 and FIG. 8.

Referring now to FIG. 10, a timing diagram is shown for the circuits of FIGS. 7 and 8. Assuming that there are five lines for dithering. The signature reload occurs at the beginning of each line. Signal EN1 is enabled from the start of first line to the fifth line. Signal EN2 is enabled from the start of second line to the fifth line and signal EN3 is enabled from the start of third line to the fifth line. This process is repeated for each enable signal (EN1 through EN5). Hence, the SEQ1 signal is available from first line to the fifth line and the SEQ2 signal is available from second line to the fifth line. This process is repeated for each of the sequence signals SEQ1 through SEQ5 as shown.

Figure 11:
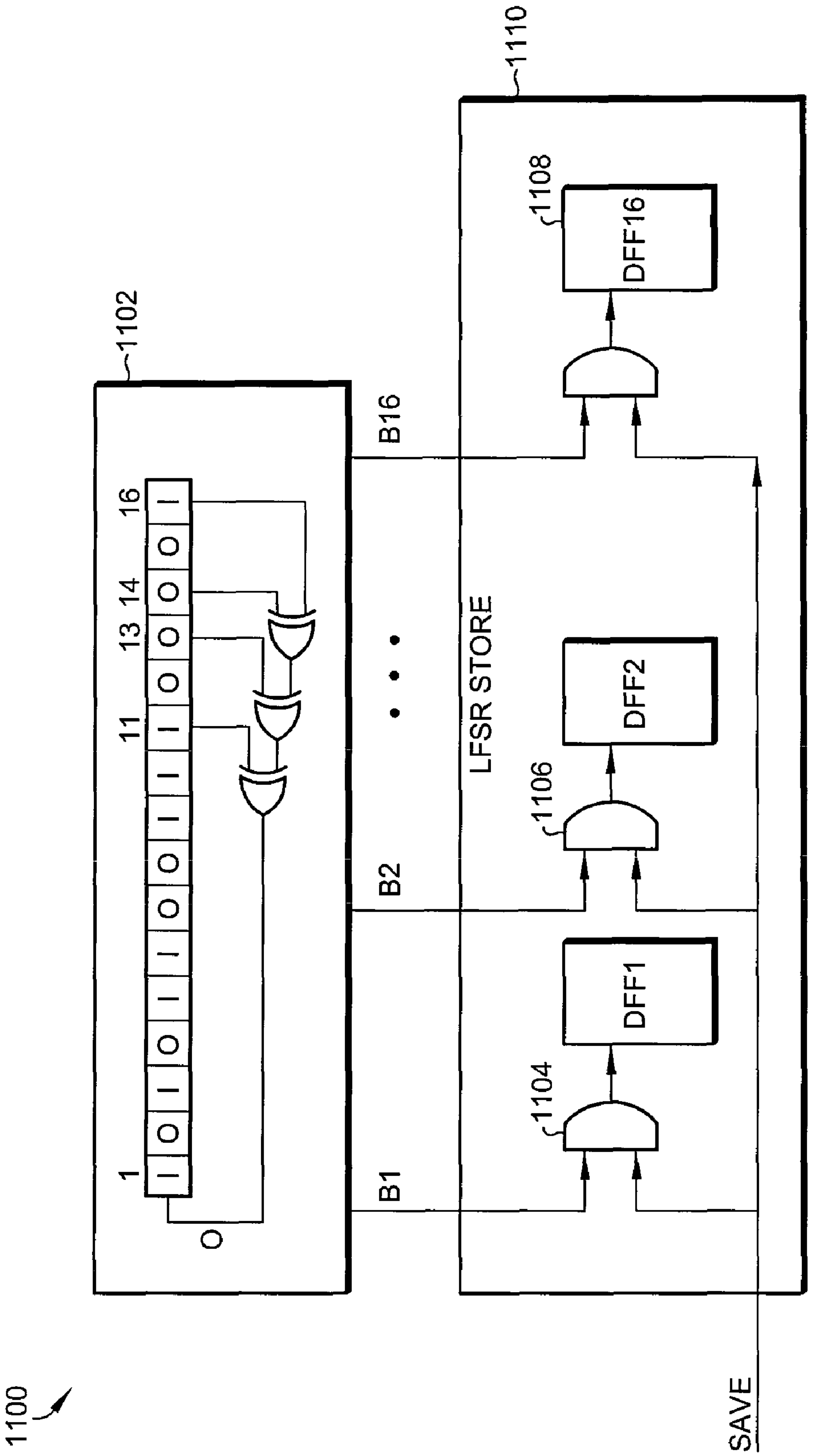
FIG. 11 is a schematic diagram showing further detail of an LFSR store according to the present invention.

Referring now to FIG. 11, the schematic diagram shows the design for an LFSR and LFSR store 1100 according to the present invention. An LFSR 1102 is shown to have outputs B1, B2, . . . B16. The outputs are coupled to LFSR store 1110. The LFSR store 1110 receives a SAVE input signal, as well as the outputs from the LFSR 1102. The first input of AND gate 1104 receives the B1 output signal and the second input of AND gate 1104 receives the SAVE signal. The output of AND gate 1104 is coupled to the input of flip-flop DFF1. The first input of AND gate 1106 receives the B2 output signal and the second input of AND gate 1106 receives the SAVE signal. The output of AND gate 1106 is coupled to the input of flip-flop DFF2. The intermediate bits are not shown in FIG. 11. Finally, The first input of AND gate 1108 receives the B16 output signal and the second input of AND gate 1108 receives the SAVE signal. The outputs of the flip-flops are also not shown in FIG. 11.

Figure 12:
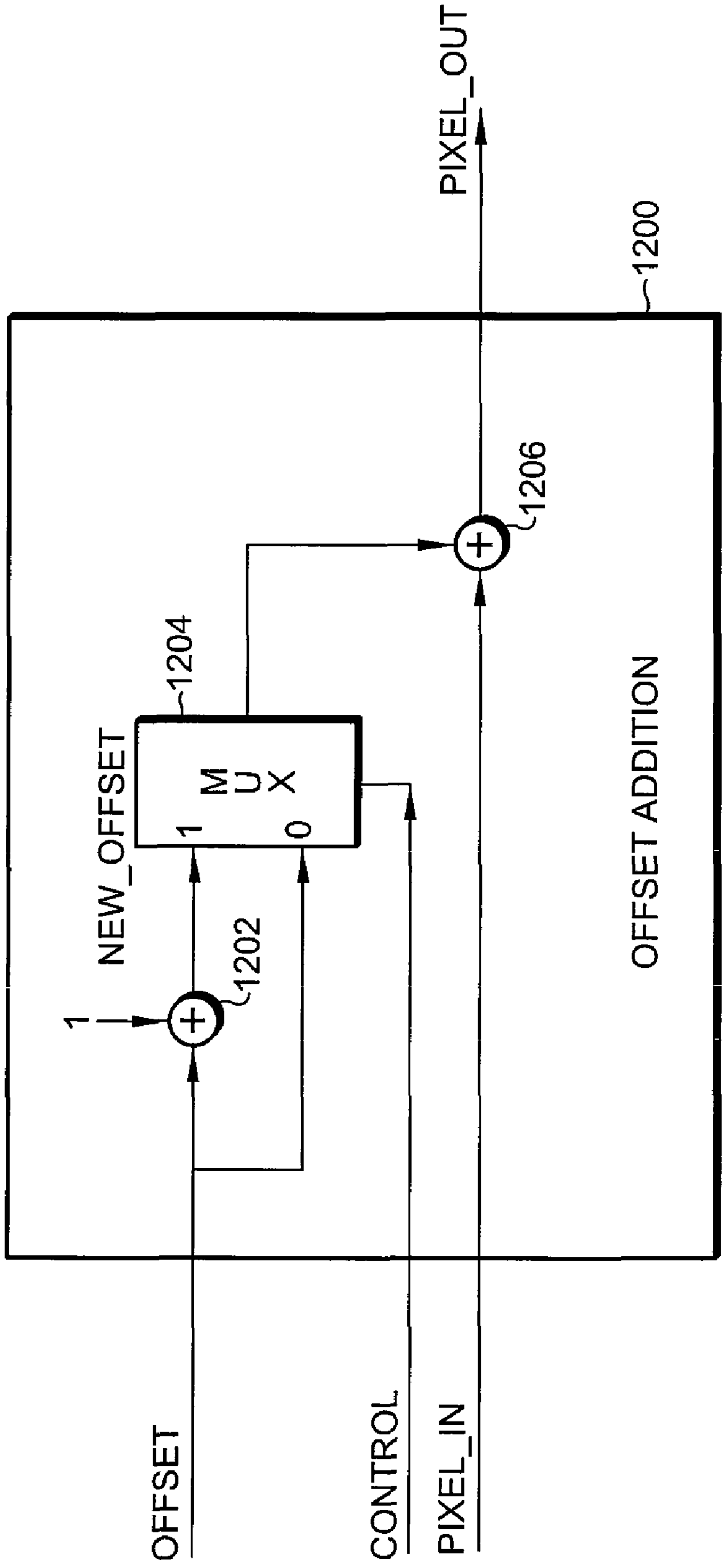
FIG. 12 is a schematic diagram of a control circuit according to the present invention.

Referring now to FIG. 12, a control circuit 1200 is shown according to the present invention. The control circuit 1200 receives the OFFSET, CONTROL, and PIXEL_IN signals, and generates a PIXEL_OUT signal according to the present invention. In one embodiment, a multiplexer 1204 is controlled by the CONTROL signal to pass either the OFFSET signal, or the OFFSET signal with an added value of one (NEW_OFFSET) using adder 1202. The output of multiplexer 1204 is summed together with the PIXEL_IN signal using adder 1206 to generate the PIXEL_OUT signal according to the present invention. Other methods for using the control signal may also be used.

In conclusion, a vertical dithering method includes providing a signature reload signal, providing a plurality of pseudo-random sequences in response to the signature reload signal, gating the pseudo-random sequences, and logically combining the gated pseudo-random sequences to generate a control signal. The pseudo-random sequences are provided by one or more Linear Feedback Shift Registers (LFSRs) each including a signature store implemented by a plurality of flip-flops. The plurality of pseudo-random sequences are gated using a plurality of enable signals. The LFSR comprises a shift register and a plurality of XOR gates. The LFSR can include a number of taps that are logically combined to create a plurality of pseudo-random sequences.

It will be apparent to those skilled in the art that various modifications and variations can be made in the present invention without departing from the spirit or scope of the invention. As would be apparent to those skilled in the art, equivalent embodiments of the present invention can be realized in firmware, software, or hardware, or any possible combination thereof. In addition, although representative block diagrams are shown for an aid in understanding the invention, the exact boundaries of the blocks may be changed and combined or separated out as desired for a particular application or implementation. Thus, it is intended that the present invention cover the modifications and variations of this invention provided they come within the scope of the appended claims and their equivalents.

We claim:

1. A vertical dithering circuit for dithering N lines comprising:

a signature reload input;

a plurality Linear Feedback Shift Registers (LFSRs) each having an input coupled to the signature reload input and an output for providing a sequenced output signal;

a first logic circuit having a plurality of inputs coupled to the outputs of the plurality of LFSRs, and a plurality of outputs; and a second logic circuit having a plurality of inputs coupled to the outputs of the first logic circuit, and an output for providing a control signal, wherein the first logic circuit includes portions that are selectively enabled corresponding to the number of lines from 1 to N, wherein N is an integer greater than 1.

2. The vertical dithering circuit of claim 1 wherein each LFSR comprises a signature store.

3. The vertical dithering circuit of claim 2 wherein each signature store comprises a plurality of flip-flops.

4. The vertical dithering circuit of claim 1 wherein the first logic circuit comprises a plurality of inputs for receiving a plurality of enable signals.

5. The vertical dithering circuit of claim 1 wherein the first logic circuit comprises a plurality of AND gates.

6. The vertical dithering circuit of claim 1 wherein the second logic circuit comprises an OR gate.

7. The vertical dithering circuit of claim 1 wherein each of the LFSRs comprises a shift register and a plurality of XOR gates.

8. A vertical dithering method for dithering N lines comprising:
- providing a signature reload signal;
- providing a plurality of pseudo-random sequences in response to the signature reload signal;
- gating the pseudo-random sequences corresponding to the number of lines from 1 to N, wherein N is an integer greater than 1; and
- logically combining the gated pseudo-random sequences to generate a control signal; wherein the pseudo-random sequences are provided by a plurality of Linear Feedback Shift Registers (LFSRs).

9. The vertical dithering method of claim 8 wherein each of the plurality of LFSR comprises a signature store.

10. The vertical dithering method of claim 9 wherein each signature store comprises a plurality of flip-flops.

11. The vertical dithering method of claim 8 wherein gating the plurality of pseudo-random sequences comprises using a plurality of enable signals.

12. The vertical dithering method of claim 8 wherein the LFSR comprises a shift register and a plurality of XOR gates.

13. The vertical dithering circuit of claim 1 wherein the plurality of sequenced output signals are provided by a plurality of logically combined taps of the LFSR.

* * * * *